United States Patent
Hoheisel

(10) Patent No.: US 8,649,483 B2
(45) Date of Patent: Feb. 11, 2014

(54) METHOD FOR PRODUCING A GRATING AND PHASE CONTRAST X-RAY SYSTEM

(75) Inventor: Martin Hoheisel, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 381 days.

(21) Appl. No.: 13/184,853

(22) Filed: Jul. 18, 2011

(65) Prior Publication Data

US 2012/0014511 A1 Jan. 19, 2012

(30) Foreign Application Priority Data

Jul. 19, 2010 (DE) .......................... 10 2010 027 596

(51) Int. Cl.
*G21K 1/06* (2006.01)
*H01L 21/02* (2006.01)

(52) U.S. Cl.
USPC ................. 378/156; 378/84; 438/63; 438/73

(58) Field of Classification Search
USPC ............. 378/70–90, 137, 204, 210; 356/328, 356/432–444, 902, 925, 947, 957; 438/14, 438/16, 57, 63, 69, 73, 74, 87, 89; 977/700, 977/701, 778, 779, 782, 784, 788, 789, 810, 977/832, 834, 840, 882, 883, 890, 892, 893, 977/895, 897, 900, 901, 902, 904, 932, 949, 977/950, 963
See application file for complete search history.

(56) References Cited

U.S. PATENT DOCUMENTS

| | | | |
|---|---|---|---|
| 3,927,930 A | 12/1975 | Goldberg et al. | 350/151 |
| 3,980,883 A * | 9/1976 | Franks | 378/84 |
| 5,298,367 A | 3/1994 | Hoessel et al. | 430/326 |
| 7,486,770 B2 * | 2/2009 | Baumann et al. | 378/62 |
| 8,515,002 B2 * | 8/2013 | Huang et al. | 378/6 |
| 2005/0142385 A1 | 6/2005 | Jin | 428/694 T |
| 2007/0183560 A1 * | 8/2007 | Popescu et al. | 378/5 |
| 2010/0224823 A1 * | 9/2010 | Yin et al. | 252/62.56 |
| 2010/0246769 A1 * | 9/2010 | David et al. | 378/84 |
| 2012/0177181 A1 * | 7/2012 | Kuwabara | 378/86 |

FOREIGN PATENT DOCUMENTS

| | | | | |
|---|---|---|---|---|
| DE | 4107662 A1 | 9/1992 | | B29C 59/16 |
| DE | 10047664 A1 | 4/2002 | | C25F 3/14 |

OTHER PUBLICATIONS

Ge, Jianping and Yadong Yin, Magnetically Tunable Colloidal Photonic Structures in Alkanol Solutions, 2008, Wiley Publishing, Advanced Materials vol. 20, pp. 3485-3491.*
Kim, H., et al., "Structural Colour Printing using a Magnetically Tunable and Lithography Fixable Photonic Crystal", Nature Photonics, vol. 3, pp. 534-540, Sep. 2009.

* cited by examiner

*Primary Examiner* — Anastasia Midkiff
(74) *Attorney, Agent, or Firm* — King & Spalding L.L.P.

(57) ABSTRACT

A method is described for producing a grating, in particular an absorption grating, having a grating constant of less than 100 μm, by using a solution of superparamagnetic colloidal nanocrystal clusters (CNCs), a solvent liquid and a photocurable resin, with the following steps: —alignment of the CNCs in the solution by an external magnetic field, —exposure of the solution, so that the resin is cured and grating structures of an intended grating constant are formed, and —removal of the magnetic field.

18 Claims, 2 Drawing Sheets

METHOD FOR PRODUCING A GRATING AND PHASE CONTRAST X-RAY SYSTEM

CROSS-REFERENCE TO RELATED APPLICATIONS

This application claims priority to German Patent Application No. 10 2010 027 596.4 filed Jul. 19, 2010, the contents of which is incorporated herein by reference in its entirety.

TECHNICAL FIELD

The invention relates to a method for producing a grating having a grating constant of less than 100 µm and to a phase contrast X-ray system.

BACKGROUND

A very promising new method for phase contrast imaging is based on the Talbot method. This does not require an expensive synchrotron as in previous known methods; rather, a conventional X-ray tube can be used. A description of the method may be found, for example, in the document U.S. Pat. No. 7,564,941 A1. In the method, various gratings which require a very small spacing of the individual bars of only a few micrometers, and furthermore a high aspect ratio, are inserted into the beam path. The production of such gratings represents a great challenge, for which there are not yet any solutions without disadvantages. One known studied technique is based on the LIGA method, the German acronym LIGA standing for the steps Lithographie, Galvanik, Abformung (Lithography, Electroplating, Molding). This method, which is described in the document DE 41 07 662 A2, is however very elaborate. An alternative method is based on the etching of porous silicon. This method is described for example in the document DE 100 47 664 A1, but is still in the test phase.

SUMMARY

According to various embodiments, a method can be procided which offers a simple and practicable way of producing a grating which has a very small grating constant and is of high quality. According to other embodiments, an X-ray device can be provided suitable for the use of such a grating.

According to an embodiment, a method for producing a grating, in particular an absorption grating, having a grating constant of less than 100 µm, by using a solution of superparamagnetic colloidal nanocrystal clusters (CNCs), a solvent liquid and a photocurable resin, may comprise the following steps: —alignment of the CNCs in the solution by means of an external magnetic field, —exposure of the solution by means of an exposure device, so that the resin is cured and grating structures of an intended grating constant are formed, and—removal of the magnetic field.

According to a further embodiment, the CNCs can be formed by clusters of single-domain nanocrystals of magnetite. According to a further embodiment, the solvent liquid can be polar and, in particular, is formed by ethanol. According to a further embodiment, the photocurable resin can be formed by polyethylene glycol diacrylates. According to a further embodiment, a digital micromirror array can be used as the exposure device. According to a further embodiment, a magnetic field strength of between 1 G and 1000 G can be used for the magnetic field. According to a further embodiment, the exposure device may generate a structured light beam pattern.

According to another embodiment, a phase contrast X-ray system may comprise an X-ray source, an X-ray detector, a phase grating and an amplitude grating, wherein at least one grating from the group consisting of phase grating and amplitude grating is produced by a method as described above.

BRIEF DESCRIPTION OF THE DRAWINGS

The invention and further advantageous configurations according to various embodiments will be explained in more detail below with the aid of schematically represented exemplary embodiments in the drawing, but without thereby restricting the invention to these exemplary embodiments.

DETAILED DESCRIPTION

Figure 1:
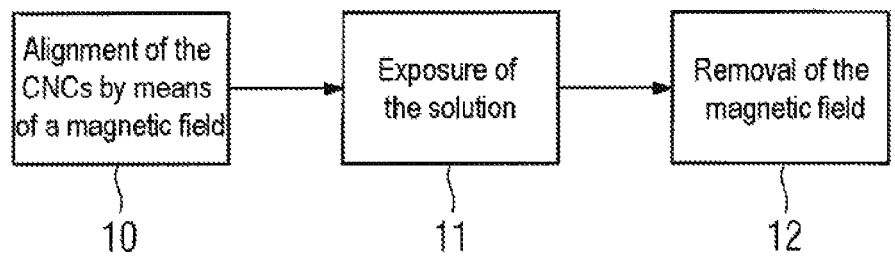
FIG. 1 shows a sequence of the method according various embodiments.

The method according to various embodiments for producing a grating having a grating constant of less than 100 µm, by using a solution of superparamagnetic colloidal nanocrystal clusters (CNCs), a solvent liquid and a photocurable resin, may comprise the following steps:
alignment of the CNCs in the solution by means of an external magnetic field,
exposure of the solution by means of an exposure device, so that the resin is cured and grating structures of an intended grating constant are formed, and
removal of the magnetic field.

By means of the method, very fine grating structures can be produced with little outlay and in a straightforward way by means of the CNCs. Besides the materials, merely the application of an external magnetic field and exposure to cure the resin are necessary. The adjustment of the grating spacings can advantageously be carried out via the exposure, for example by the application of a structured light beam pattern which is generated by the exposure device. In particular an absorption grating, for example an amplitude grating, for a phase contrast X-ray system, can be produced by means of the method.

A method for producing structural colors is known from the document "Structural color printing using a magnetically tunable and lithographically fixable photonic crystal" by Hyoki Kim, Jianping Ge, Junhoi Kim, Sung-eun Choi, Hosuk Lee, Howon Lee, Wook Park, Yadong Yin and Sunghoon Kwon, Nature Photonics Vol. 3, September 2009, pages 534 to 540. The various embodiments use in particular a solution consisting of CNCs, a solvent and a photocurable resin.

According to an embodiment, the CNCs are formed by single-domain nanocrystals of magnetite ($Fe_3O_4$). These may, for example, respectively be encapsulated by a silicon dioxide shell. Superparamagnetic magnetite can be influenced particularly easily and by means of a magnetic field.

Advantageously, for particularly good durability, solubility and easy alignability of the CNCs, polar solvent liquids may be used, for example ethanol, methanol or water.

Expediently, the photocurable resin is formed by polyethylene glycol diacrylates, in particular having 15 wt % of photoinitiator. It is also possible to use alternative photocurable resins.

A particularly advantageous exposure device can be formed by a digital micromirror array (DMD). Such a DMD forms various structured light beam patterns on demand with the aid of adjustable micromirrors. The light beam patterns can be structured very finely in this case, i.e. to significantly less than 100 μm. It is, for example, possible to use visible or UV light for the exposure. The exposure may be carried out stepwise or with a large-area exposure device, by simultaneous exposure of large regions of the solution comprising the aligned CNCs.

According to an embodiment, a magnetic field strength of between 1 G and 1000 G is used for the magnetic field.

Also, a phase contrast X-ray system can be provided comprising an X-ray source, an X-ray detector, a phase grating and an amplitude grating, wherein at least one phase grating and/or amplitude grating is produced by the method according to various embodiments. Phase contrast X-ray systems rely on particularly high quality, particularly fine gratings in order to generate X-ray images of high image quality.

Figure 2:
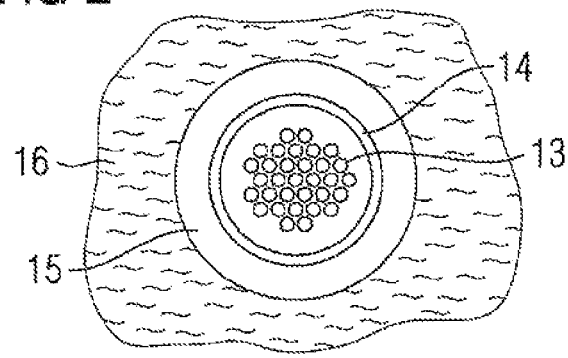
FIG. 2 shows a view of a superparamagnetic CNC in solution.

FIG. 2 shows a mixture of a colloidal nanocrystal cluster (CNC) 13, a solvent liquid such as ethanol and a resin. The CNC 13 comprises a multiplicity of single crystals of magnetite ($Fe_3O_4$) and may additionally have a thin $SiO_2$ layer 14. In the mixture, an ethanol layer 15 is formed around the CNC 13. In a solution consisting of CNCs, solvent liquid and resin, the encapsulated CNCs are randomly distributed in the resin 16.

Figure 3:
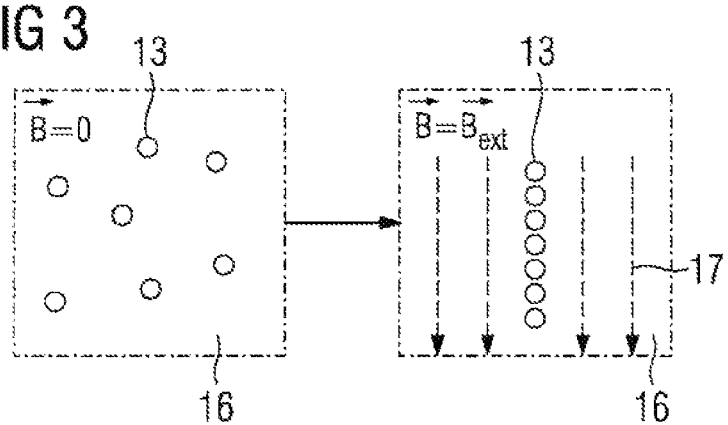
FIG. 3 shows a view of the alignment of the CNCs by means of an external magnetic field.

FIG. 1 shows a sequence of the method according to various embodiments. First, a solution consisting of colloidal magnetite nanocrystal clusters, ethanol and a photocurable resin is used as the substance for producing the grating. The nanocrystal clusters 13 are initially distributed randomly in the solution. In order to align the nanocrystal clusters, in a first step 10 an external magnetic field $B_{ext}$ is applied to the solution. By the external magnetic field, the nanocrystal clusters are aligned in the direction of the magnetic field lines of the magnetic field and form chain-like structures. This is shown by way of example in FIG. 3. On the left-hand image in FIG. 3, no external magnetic field is applied and the nanocrystal clusters 13 are distributed randomly in the resin 16. By the application of the magnetic field $B_{ext}$, the CNCs 13 are aligned along the magnetic field lines 17 and form chains of CNCs 13. The alignment and the spacing of the individual CNCs result from an equilibrium between the attractive magnetic forces due to the superparamagnetic CNCs and the repulsive electrostatic or solution forces. The strength of the external magnetic field may in this case be used, for example, to vary the spacings between the CNCs.

Following the alignment of the CNCs 13, the solution is exposed by means of an exposure device 26 in a second step 11. The grating constant and the width of the bars of the grating to be produced are in this case determined by the exposed shape and area. Thus, a multiplicity of exposure beams can be formed and aligned precisely like the intended structures of the grating, for example in the form of a matrix or a line structure with a fixed grating constant. Thus, large regions of the grating can be produced simultaneously. As the exposure device, for example a digital microarray (DMD) may be used which can generate any desired pattern of exposure beams by means of micromirrors. It is also possible to employ one exposure beam or a few exposure beams, which are used in succession repeatedly for the exposure while respectively being displaced by particular distances. In this way, a grating structure with a desired grating constant can likewise be produced.

At all exposed positions of the solution, the resin is cured and therefore forms bars of a grating together with the now fixed CNCs. In a third step 12, the external magnetic field $B_{ext}$ is removed so that the alignment of the CNCs at the unexposed positions of the solution is terminated. Subsequently, for example, the still liquid solution may be removed by washing. The cured bars, which form a grating, therefore remain.

Figure 4:
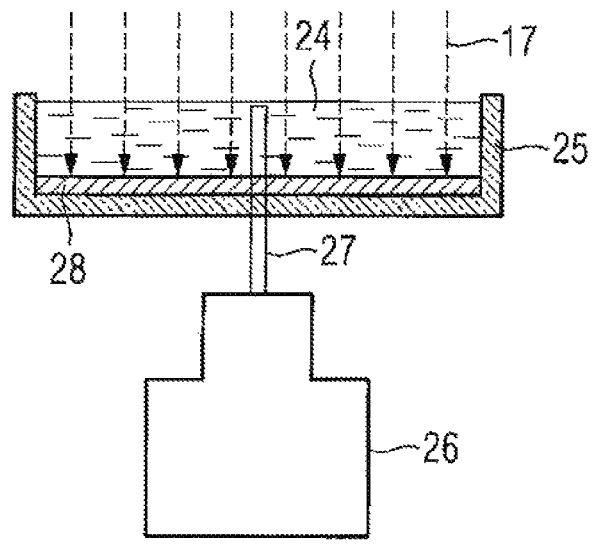
FIG. 4 shows a view of an exposure device for carrying out the method according to various embodiments.

FIG. 4 shows an exposure device 26 which, by means of an exposure beam 27, exposes the solution 24 comprising the CNCs aligned by the external magnetic field $B_{ext}$, and thereby cures the resin at the desired positions in order to produce a grating. For stabilization, the grating may for example be grown on a substrate 28. The solution 24 and the substrate 28 may, for example, be arranged in a container 25 which is transparent to the light.

Figure 5:
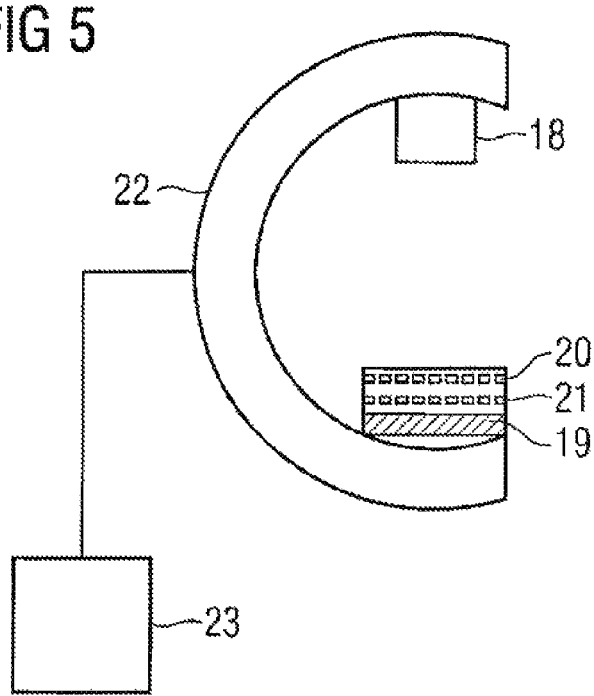
FIG. 5 shows a view of a phase contrast X-ray system comprising an amplitude grating.

FIG. 5 shows a phase contrast X-ray system which comprises at least a grating generated by the method according to various embodiments, namely an amplitude grating 21. The phase contrast X-ray system comprises a C-arm 22, which supports an X-ray source 18 and an X-ray detector 19. A phase grating 20 and an amplitude grating 21 are placed in front of the X-ray detector 19. The components of the phase contrast X-ray system are driven by a system controller 23. The X-ray source 18 emits quasi-coherent X-radiation, or the incoherent X-radiation is converted into quasi-coherent X-radiation by a device. The basic concept of phase contrast imaging is to find the exact position of interference lines generated by means of the phase grating from quasi-coherent X-radiation passing through an object to be studied, and to determine therefrom the phase shift due to the object to be studied. Yet since the spacings of the interference lines are in the micrometer range, a normal X-ray detector does not have sufficient resolution to image the interference lines or their maxima. For this reason, the amplitude grating, with low X-ray transparency and as far as possible the same periodicity and orientation as the interference lines, is arranged directly in front of the X-ray detector and the interference lines are sampled with it.

The method according to various embodiments makes it possible to produce even very fine grating structures with the aid of CNCs, and thereby straightforwardly adjust the grating spacings by changing the strip structure or matrix structure projected on.

The various embodiments may be summarized briefly as follows: A method is described for producing a grating, in particular an absorption grating, having a grating constant of less than 100 μm, by using a solution of superparamagnetic colloidal nanocrystal clusters (CNCs), a solvent liquid and a photocurable resin, comprising the following steps:
alignment of the CNCs in the solution by means of an external magnetic field,
exposure of the solution, so that the resin is cured and grating structures of a provided grating constant are formed, and
removal of the magnetic field.

What is claimed is:
1. A method for producing a grating having a grating constant of less than 100 μm, by using a solution of superparamagnetic colloidal nanocrystal clusters (CNCs), a solvent liquid and a photocurable resin, the method comprising the following steps:
alignment of the CNCs in the solution by means of an external magnetic field,
exposure of the solution by means of an exposure device, so that the resin is cured and grating structures of an intended grating constant are formed, and
removal of the magnetic field.

2. The method according to claim 1, wherein the grating is an absorption grating.

3. The method according to claim 1, wherein the CNCs are formed by clusters of single-domain nanocrystals of magnetite.

4. The method according to claim 1, wherein the solvent liquid is polar.

5. The method according to claim 1, wherein the solvent liquid is polar and is formed by ethanol.

6. The method according to claim 1, wherein the photocurable resin is formed by polyethylene glycol diacrylates.

7. The method according to claim 1, wherein a digital micromirror array is used as the exposure device.

8. The method according to claim 1, wherein a magnetic field strength of between 1 G and 1000 G is used for the magnetic field.

9. The method according to claim 1, wherein the exposure device generates a structured light beam pattern.

10. A phase contrast X-ray system comprising
an X-ray source,
an X-ray detector,
a phase grating and an amplitude grating,
a solution of superparamagnetic colloidal nanocrystal clusters (CNCs),
a solvent liquid and
a photocurable resin,
wherein the system is configured to generate a magnetic field such that the CNCs are aligned in the solution,
an exposure device for exposing of the solution so that the resin is cured and grating structures of an intended grating constant are formed, and
wherein the system is configured to remove the magnetic field to produce at least one grating from the group consisting of phase grating and amplitude grating.

11. The system according to claim 10, wherein the grating is an absorption grating.

12. The system according to claim 10, wherein the CNCs are formed by clusters of single-domain nanocrystals of magnetite.

13. The system according to claim 10, wherein the solvent liquid is polar.

14. The system according to claim 10, wherein the solvent liquid is polar and is formed by ethanol.

15. The system according to claim 10, wherein the photocurable resin is formed by polyethylene glycol diacrylates.

16. The system according to claim 10, wherein a digital micromirror array is used as the exposure device.

17. The system according to claim 10, wherein a magnetic field strength of between 1 G and 1000 G is used for the magnetic field.

18. The system according to claim 10, wherein the exposure device generates a structured light beam pattern.

* * * * *